United States Patent [19]

Moennig

[11] 4,016,453
[45] Apr. 5, 1977

[54] PROXIMITY PAD WITH CONTROLLED ILLUMINATION

[76] Inventor: Herald Richard Moennig, 716 Inverrary Lane, Deerfield, Ill. 60015

[22] Filed: Mar. 15, 1976

[21] Appl. No.: 667,114

[52] U.S. Cl. .................. 315/312; 307/38; 307/308; 315/135; 315/178; 315/360; 315/362; 328/5
[51] Int. Cl.² .................. H05B 37/02; H05B 39/06
[58] Field of Search .................. 328/5; 200/DIG. 1; 317/DIG. 2; 307/247 R, 308, 31, 38, 42; 340/258 B, 258 C; 315/129–131, 135, 136, 178, 312, 313, 360, 362, DIG. 4

[56] References Cited

UNITED STATES PATENTS

| 3,307,071 | 2/1967 | Diamond | 315/129 X |
| 3,648,107 | 3/1972 | Rydborn | 315/360 |
| 3,666,988 | 5/1972 | Bellis | 315/362 X |
| 3,787,732 | 1/1974 | Larson | 200/DIG. 1 |
| 3,965,465 | 6/1976 | Alexander | 340/258 C X |

Primary Examiner—Eugene R. LaRoche
Attorney, Agent, or Firm—Tilton, Fallon, Lungmus, Chestnut & Hill

[57] ABSTRACT

A small thin console or pad has a metal proximity switch actuated by a control ring mounted on one surface, with a small light bulb within the ring. The pad is used for remote control of a load which may be a lamp, or some other electric appliance such as a radio or stereo. The pad is connected to a wall outlet unit containing a triac as a switching device for the load. The light bulb on the pad is normally at a low glow for a night light. When the metal ring is first touched the triac is turned on for the load; and when it is touched again the triac is turned off, thereby shutting off the load, while the light on the pad is brought up to full brilliance for a predetermined interval of time as a courtesy light, and then returns to the normal night light intensity.

9 Claims, 3 Drawing Figures

PROXIMITY PAD WITH CONTROLLED ILLUMINATION

BACKGROUND OF THE INVENTION

This invention relates to a proximity pad and control circuit, particularly for remote control of a load.

Proximity control, using the capacitance of the body upon touching or nearly touching a metal element, is well known. This type of circuit has been used for remote control of various types of load, including lights, and even for calling elevators. Many of these circuits include electro-mechanical devices such as relays or stepping switches. They may also require two separate touch-responsive elements for on and off control, or one touch device and a separate switch of another type.

SUMMARY OF THE INVENTION

An object of this invention is to provide an arrangement to control a load, using a very small and portable remote pad with a proximity switch element which can be readily used in a darkened room.

The proximity pad according to the invention comprises a small thin housing with a metal element and a light thereon, and containing electronic control circuits for controlling a load. The control circuits are actuated by touching the metal element to operate a switching device to alternately turn the load on and off. The light on the pad is normally at a low level of illumination, but it is brought to a higher level for a predetermined interval of time each time the load is turned to off. This permits the user, for example, to get into bed under greater illumination which is reduced to night light level after he has entered his bed.

One particular feature of the system is that the control circuits include a bistable circuit with an input from the metal element to change the bistable state when the metal element is touched. Separate outputs from the bistable circuit control the load switching device and the light on the pad.

An advantage of the small, thin control pad which may conveniently be placed just about anywhere is that it is illuminated at a low level so that it may be easily located in a darkened room. As mentioned, the same light on the control pad also functions as a "courtesy light" for a predetermined time to supply a higher level of illumination for a short time after the main load appliance is turned off.

Persons skilled in the art will readily appreciate other features and advantages of the present invention from the following detailed description accompanied by the attached drawing.

DESCRIPTION OF THE PREFERRED EMBODIMENT

Figure 1:
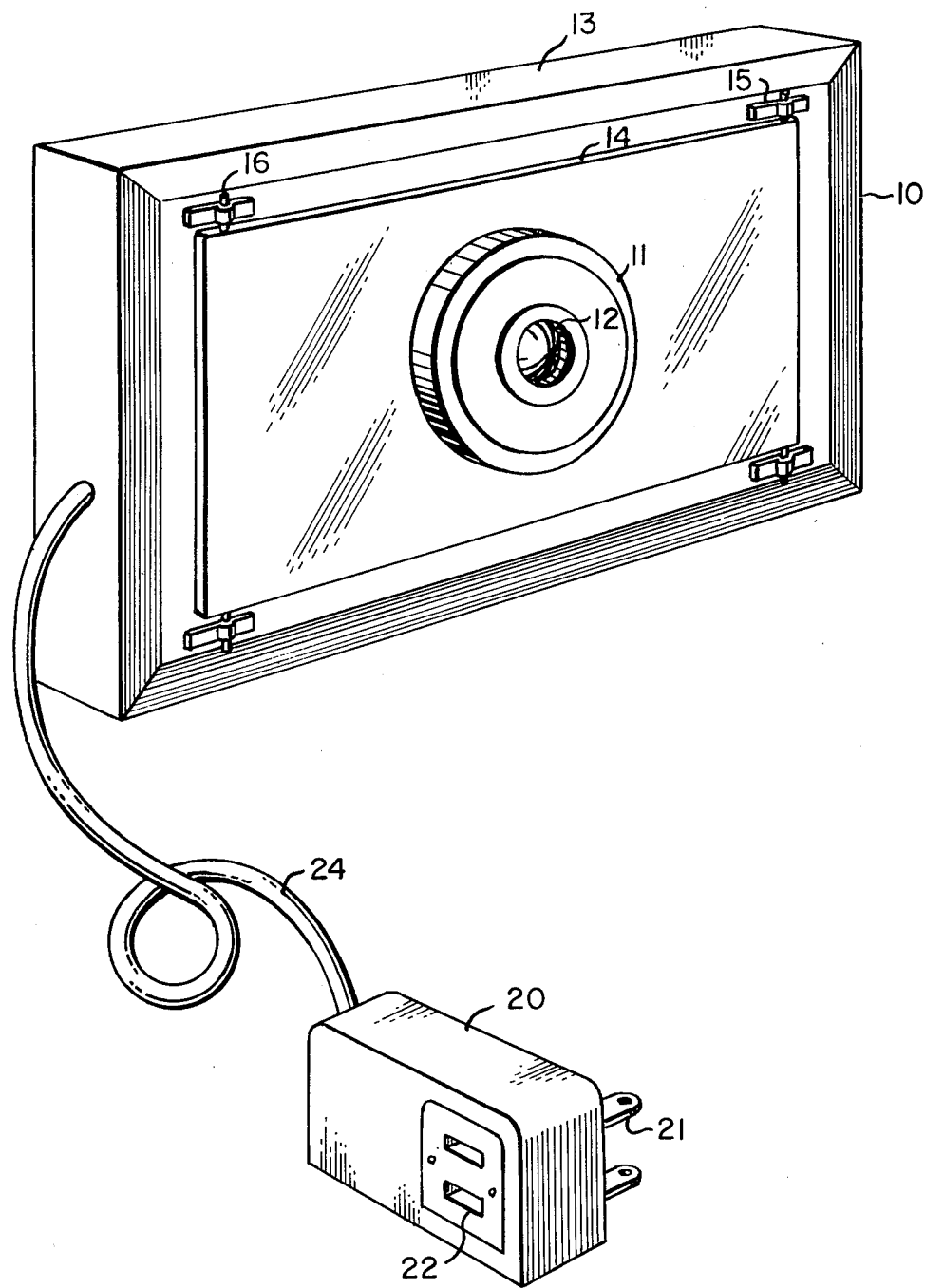
FIG. 1 is a perspective view of the control pad, and of the unit which plugs into an outlet and supplies an outlet for the main load.

The perspective view of FIG. 1 shows the small thin control pad 10, and an outlet unit 20 interconnected by a low voltage cord 24. The pad 10 is shown on its side for clarity of illustration only. In normal use it lies flat; and its low profile is considered desirable. The unit 20 has a plug 21 for plugging into any 120-volt alternating current outlet. An outlet 22 incorporated in the unit 20 is for the load. A great variety of appliances, such as lamps, radios, stereos, etc. can be plugged into it; and at the touch of a hand, the appliance may be either turned on or off.

The pad 10 has an aluminum proximity ring 11 at the center of its upper surface. Mounted inside the ring 11, there is a 12-volt light bulb 12, which is used both as a night light and a courtesy light. The pad has a plastic case 13. On the top surface there is a clear Plexiglas sheet 14. There are four plastic ears 15 that retain the Plexiglas sheet, held by tiny allen screws 16. The overall pad is about the size of an ordinary deck of playing cards.

Figure 2:
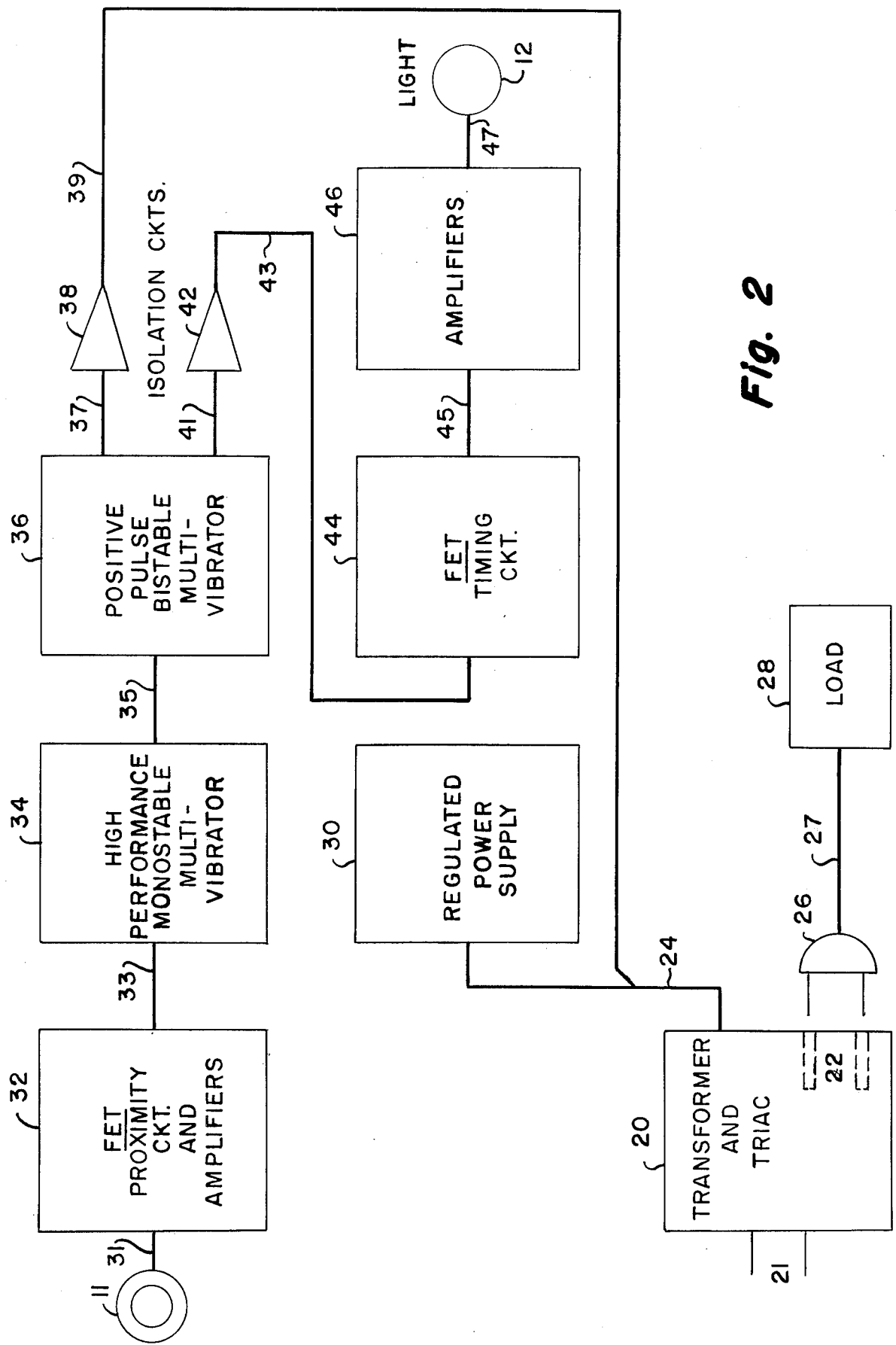
FIG. 2 is a functional block diagram of the electronic circuits.

In the block diagram of FIG. 2, the outlet unit 20 and load 28 are shown at the bottom, and the remaining blocks 32–46 at the top and center represent the control circuits within the pad 10. The load 28 may by way of example be a lamp which supplies general room lighting in a bedroom. It has a line cord 27 with a plug 26 which is plugged into the outlet 22. Within the unit 20, a triac solid state switching device couples the wall outlet 22 to the 120-volt input plug 21. The unit 20 also includes a fuse for the load, and a transformer to supply low voltage over the cord 24 to a regulated power supply 30 in the pad 10, which in turn supplies low voltage direct current to the control circuits of the pad 10.

The pad, or small console 10, is completely portable and may be conveniently located, for example, next to a bed—i.e., remote from the outlet as well as the appliance being controlled. The lamp 12, which as shown in FIG. 1 is located within the ring 11, glows with a dull glow normally. The dull glow provides sufficient illumination to locate the ring 11.

The fact that the ring 11 surrounds and is adjacent to the lamp is also considered an important feature of the invention. When the ring 11 is first touched, the control circuits cause continuity to be established to the load 28; but when it is next touched it disconnects the load 28, and causes the lamp 12 to glow more intensely for a predetermined period of time (sufficient, for example, to enable a person to return to bed), and then the circuitry reduces the illumination of the bulb 12 to the normal dull glow.

The principal elements of the control circuits are a proximity circuit 32 which responds to touching the ring 11, thereby actuating a monostable multivibrator 34 to supply a pulse for changing the state of a bistable circuit 36. One output signal of the bistable circuit via an isolation circuit 38 and a lead 39 through the cord 24 controls the triac switch in unit 20. The complementary output signal of the bistable circuit 36, via an isolation circuit 42, actuates timing circuitry 44 which via amplifiers 46 supplies the proper current to illuminate the lamp 12 as described above.

Figure 3:
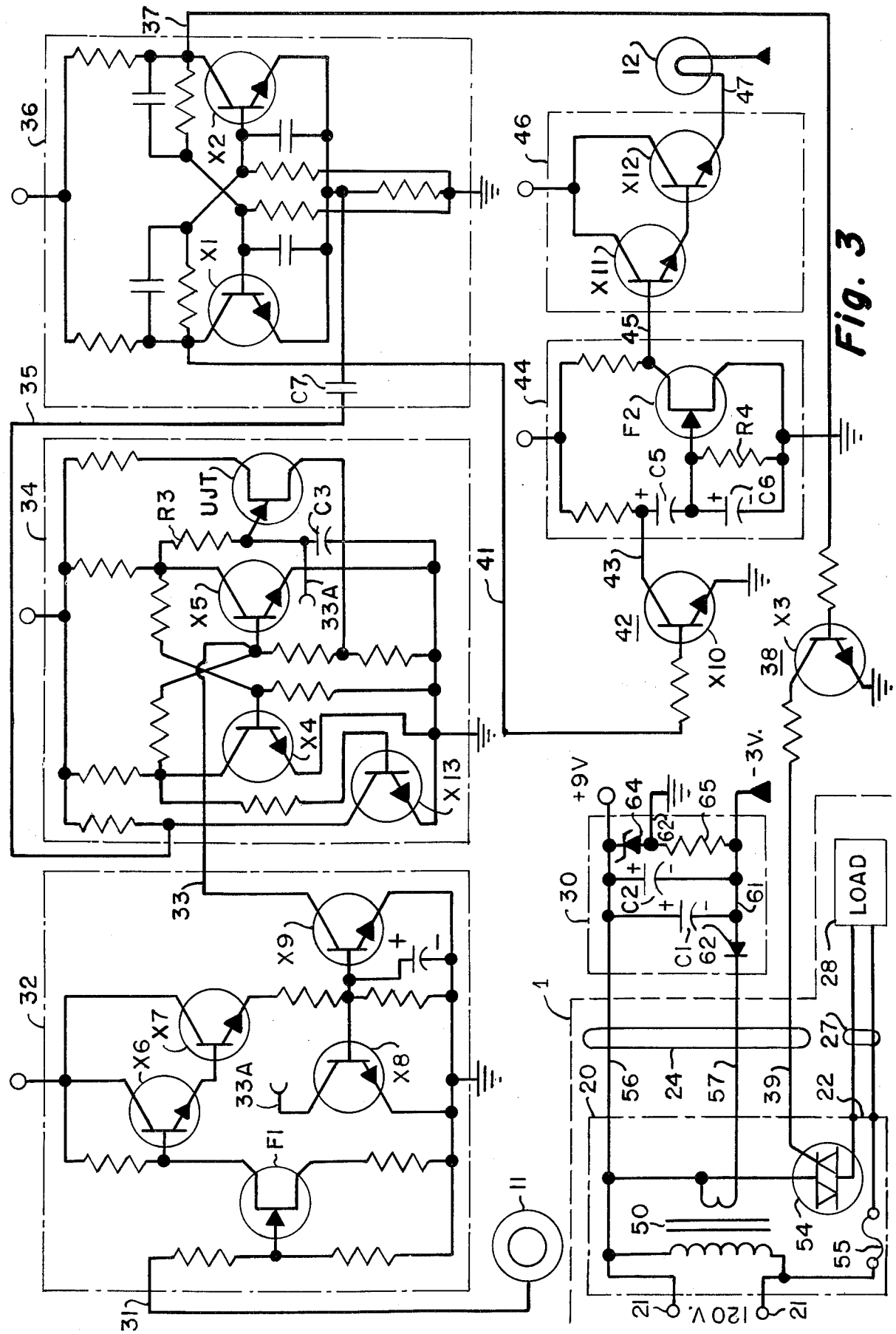
FIG. 3 is a circuit schematic diagram of the electronic circuits.

In the schematic diagram of FIG. 3, the unit 20 and load 28 are shown in the lower left-hand corner; and all of the other circuits above and to the right of line 1 are part of the pad 10. The unit 20 includes a transformer 50 having its primary winding connected across the 120-volt alternating current input terminals 21, and a 12.5-volt, 300 milliampere secondary winding connected across conductors 56 and 57 of the low voltage cord 24. Note that the conductor 56 is a common conductor also connected to one side of the 120-volt input line. A triac solid state switching device 54 has its M2 terminal connected to conductor 56, its M1 terminal connected to one of the terminals of outlet 22 for the load 28, and its gate connected to the control conductor 39 of cord 24. A fuse 55 is connected between the other terminal of outlet 22 and the other alternating current input terminal of plug 21. The triac 54 has a 10-ampere rating, with a 10-milliampere trigger current.

The regulated power supply 30 supplies plus 9 volts to a bus represented by a round terminal from lead 56, minus 3 volts to a bus represented by a triangular terminal from lead 61, and an intermediate potential bus represented by the ground symbol from lead 62. A rectifying diode 60, rated at 1 ampere and 200 peak inverse volts, is connected with its cathode to lead 57 and its cathode to lead 61. Two electrolytic capacitors C1 and C2 each rated at 200 microfarads and 25 volts, are connected in parallel between leads 56 and 61 as a filter. A 9-volt, one watt Zener diode 64 between leads 56 and 62 regulates the 9-volt output. A 39-ohm, one watt resistor 65 is connected between leads 61 and 62.

The proximity circuit 32 has an FET device F1 (field effect transistor) at the input; and four transistors —X6 and X7 provide amplification, while X8 and X9 serve as a trigger and latch circuit. Between the input lead 31 from the ring 11 and the gate of device F1 there is a 10-megohm resistor, in series with a one-megohm resistor between the gate and ground. The source electrode of device F1 is connected to ground via a 2,200-ohm resistor, and the drain electrode is connected to plus 9 volts via a 100,000-ohm resistor. Transistors X6 and X7 in a Darlington configuration with the emitter of transistor X6 directly connected to the base of transistor X7, have their collector electrodes connected directly to plus 9 volts, the base electrode of transistor X6 connected from the drain electrode of the FET device F1, and the emitter electrode of transistor X7 connected via a 1,000-OHM Resistor R1 and from there is series with a 100-OHM Resistor R2 to ground. The base electrodes of transistors X-8 and X-9 are connected between R1 and R2, and the emitter electrodes of both transistors are returned to ground. Transistor X-8 has its collector electrode connected directly to lead 33A, while the collector electrode of X-9 is connected directly to lead 33. One lead of a 10 microfarad, 25 volt electrolytic capacitor C4 is connected to the base electrodes of X-8 and X-9, the other lead is returned to ground.

Transistor X-13 and its associated components have to be described as an isolation and amplification circuit, to be described. The high performance monostable multivibrator 34 comprises two transistors X4 and X5 and a unijunction transistor UJT. The transistors X4 and X5 each have the collector electrode connected via a 1,000-ohm resistor to plus 9 volts, and the emitter electrode connected directly to ground. The collector lead 33 is connected to the base electrode of X-5 and, via a 10,000 ohm resistor, in series with a 680-OHM resistor to ground. The base electrode of X-5 is connected via a 10,000 ohm resistor to the collector electrode of X-4. The base electrode of transistor X4 is connected via a 47,000-ohm resistor to the collector electrode of X5, and also via a 10,000-ohm resistor to ground. The first base electrode of device UJT is connected between a 10,000 ohm and a 680 ohm resistor in the base circuit of transistor X-5. The emitter electrode of device UJT is connected via a 47,000-ohm resistor R3 to the collector electrode of transistor X5, and also via a 1-microfarad, 35-volt electrolytic capacitor C3 to ground. The second base electrode of device UJT is connected via a 1,000-ohm resistor to plus 9 volts. The uni-junction device UJT is rated Ie = 50 milliamperes $E\text{-}B_2$ $R_V$ 30 V.

The positive pulse bistable multivibrator comprises two transistors X1 and X2. The transistors have their emitter electrodes connected together and via a 100-ohm resistor to ground, the collector electrodes connected via 680-ohm resistors to plus 9 volts, the collector electrode of each connected via a 2,200-ohm resistor in parallel with a 0.047-microfarad capacitor to the base electrode of the other, each base electrode connected via a 3,900-ohm resistor to ground and also via 0.01-microfarad capacitor to the common emitter connection. The input from lead 35 is coupled via a 0.22-microfarad capacitor C7 to the common emitters. Outputs on leads 37 and 41 are from the collector electrodes of transistors X2 and X1 respectively.

The isolation circuit 38 comprises a single transistor X3 with input from lead 37 via a 47,000-ohm resistor to its base electrode, output via a 330-ohm resistor from its collector electrode to lead 39, and its emitter electrode grounded. Similarly the isolation circuit 42 comprises a single transistor X10 with an input from lead 41 via an 82,000-ohm resistor to its base electrode, an output from its collector electrode to lead 43, and its emitter electrode grounded.

The timing circuit 44 comprises an FET device F2. The input lead 43 is connected via two 4.7-microfarad, 25-volt electrolytic capacitors C5 and C6 in series to ground, with the junction point between them connected to the gate electrode of device F2, and also via a one-metohm resistor R4 in parallel with capacitor C6 to ground, the input lead 43 is also connected via an 820-ohm resistor to plus 9 volts. The source electrode of device F2 is connected to ground, and the drain electrode is connected to the output lead 45 and also via a 10,000-ohm resistor to plus 9 volts.

The amplifier 46 comprises transistors X11 and X12 in a Darlington configuration with the emitter electrode of transistor X11 connected to the base electrode of transistor X12, both collector electrodes connected directly to plus 9 volts, the base electrode of transistor X11 to input lead 45, and the emitter electrode of transistor X12 to the output lead 47.

The lamp 12 is connected between lead 47 and minus 3 volts.

The FET devices F1 and F2 are both N-channel type ORT-175. The transistors X1, X2, X4, X5, X7, X8, X9, X11, X12 and X13 are type 2N2222; and transistors X3, X6, and X10 are type 2N3904.

OPERATION

Upon touching the metal ring 11, the capacitance of the person's body increases the reverse bias voltage on the gate of the FET device F1. This, in turn, takes the base of transistor X6 to a higher positive potential and through amplification of transistors X6 and X7 produces approximately three volts across R1 and R2. Using a stiff voltage divider network, (R1 being approximately 10 times the resistance of R2) and also shunting R2 with a 10-microfarad capacitor C-4, gives the proximity circuit good stability against power line variations and especially static charges built up on a person's body. The DC voltage developed across R2, forward biases the base electrodes of transistors X8 and X9, allowing both transistors to be in a conductive state. The collector of X9 shunts the base electrode of X5, and therefore, switches the monostable multivibrator from its stable to its unstable state; and through amplification of X13, the bistable multivibrator receives a positive pulse via lead 35 and capacitor C7, which enables the circuit to switch from one state to another. At the same instant, the collector of X8 shunts capacitor C3, inhibiting the UJT from firing, which would return the monostable to its stable state.

Upon releasing the metallic ring 11, the voltage across R2 drops to zero or ground level, this returns transistors X8 and X9 to nonconductive states, allowing capacitor C3 to charge to a predetermined voltage which will cause the UJT to fire, and this returns the monostable 34 to its stable state. This direct-coupled method eliminates any capacitors in the proximity circuit, giving a faster response time and also a more reliable proximity switch.

The bistable circuit 36 controls both the triac 54 and the light circuit 12. When transistor X2 is in a non-conductive state, the triac 54 is turned on through transistor X3 of the isolation circuit 38; and in the conductive state of transistor X2 the triac 54 is turned off. The triac 54 is the switching device for turning the load 28 on and off.

When transistor X1 of the bistable circuit 36 is in a conductive state, the collector of transistor X10 of the isolation circuit 42 climbs to a high positive potential, charging the capacitor C5 of the timing circuit 44 through the forward bias junction of the FET device F2. In the non-conductive state of transistor X1, the collector of transistor X10 drops to practically zero, and the capacitor C5 now has to discharge through resistor R4, because the junction between the gate and the source of device F2 is now reverse-biased. As can be seen, this drives the FET device F2 into a non-conductive state for a period of time, depending upon the RC time constant of Capacitor C5 and Resistor R4. When the device F2 is driven into a non-conductive state, through amplification of transistors X11 and X12, the 12-volt AC light bulb 12 is illuminated to full brightness (approximately 50 milliamperes courtesy light), then as the device F2 returns to its conductive state, the current dissipates to approximately 15 milliamperes (night light) but will never completely extinguish the light because the emitter of transistor X12 is connected via the light bulb to negative 3 volts below ground. The function of capacitor C6 is to allow for the courtesy light to gradually taper back to a night light.

I claim:

1. Apparatus comprising a control unit and a load switching unit; said load switching unit including a switching device coupled between an electric source and a load, and a control lead to the switching device from the control unit; said control unit comprising a metal touch element, an electric light, and control circuits; said control circuits having an input connection from the metal element, a first output connection to the electric light, and a second output connection to said control lead; means for normally supplying current to the electric light to energize it for a low level of illumination; means actuated each time said metal touch element is touched for changing a signal at the second output connection to switch said switching device between on and off to thereby alternately energize and de-energize the load; and means effective when the switching device is switched to off for supplying current via said first output connection to energize said electric light to a high level of illumination and to return it to the low level after a predetermined interval of time.

2. Apparatus as set forth in claim 1, wherein said metal element is shaped as a ring, and said electric light is mounted within said ring.

3. Apparatus as set forth in claim 2 wherein said control unit is a small thin pad having a plastic case, with a Plexiglas sheet forming one surface, and said ring and electric light are mounted in the center of the Plexiglas sheet.

4. Apparatus as set forth in claim 1, wherein said control circuits include bistable means having first and second states, input circuit means coupling the metal element to the bistable means to change the state of the bistable means in response to touching the metal element, first output means coupled between the bistable means and the electric light, and second output means coupled between the bistable means and the control lead to the load switching means, the load switching means being on to energize the load via the second output means in response to the bistable means being in its first state, and being off in response to the bistable means being in its second state, wherein said first output means includes timing means which is actuated when the bistable means changes from its first state to its second state to energize the electric light to said high level, said timing means providing the measurement of said predetermined interval of time.

5. Apparatus as set forth in claim 4, wherein said switching device is a solid-state device.

6. Apparatus as set forth in claim 5, wherein said switching device is a triac having a gate electrode connected to said control lead.

7. Apparatus as set forth in claim 4, wherein said input circuit means comprises a field effect transistor circuit with an input connected to said metal element, amplifying means having direct coupling from the field effect transistor circuit, and a monostable circuit means coupled between said amplifying means and said bistable means to supply a pulse to change the state of the bistable means.

8. Apparatus as set forth in claim 4, wherein said timing means comprises a field effect transistor circuit which includes resistance-capacitance means for timing.

9. Apparatus as set forth in claim 4, wherein said metal element is shaped as a ring, and said electric light is mounted within said ring.

* * * * *